United States Patent
Jung et al.

(10) Patent No.: US 8,907,490 B2
(45) Date of Patent: Dec. 9, 2014

(54) SEMICONDUCTOR PACKAGES HAVING THE FIRST AND SECOND CHIP INCLINED SIDEWALLS CONTACT WITH EACH OTHER

(75) Inventors: So Hyun Jung, Busan (KR); Bok Gyu Min, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 62 days.

(21) Appl. No.: 13/617,318

(22) Filed: Sep. 14, 2012

(65) Prior Publication Data

US 2013/0249108 A1    Sep. 26, 2013

(30) Foreign Application Priority Data

Mar. 20, 2012 (KR) .................. 10-2012-0028335

(51) Int. Cl.
*H01L 23/48* (2006.01)
*H01L 23/02* (2006.01)
*H01L 23/04* (2006.01)
*H01L 21/66* (2006.01)

(52) U.S. Cl.
USPC .............. 257/774; 257/686; 257/698; 438/17

(58) Field of Classification Search
USPC .......... 257/686, 774, 777, 786, 698; 438/109, 438/17
See application file for complete search history.

(56) References Cited

U.S. PATENT DOCUMENTS

| 7,589,410 | B2 | 9/2009 | Kim | |
|---|---|---|---|---|
| 2007/0202617 | A1* | 8/2007 | Hembree | 438/17 |
| 2008/0054444 | A1* | 3/2008 | Tuttle | 257/698 |
| 2008/0083977 | A1* | 4/2008 | Haba et al. | 257/686 |
| 2008/0308921 | A1* | 12/2008 | Kim | 257/686 |
| 2011/0079890 | A1* | 4/2011 | Song et al. | 257/686 |

FOREIGN PATENT DOCUMENTS

| KR | 10-1999-0066529 | 8/1999 |
|---|---|---|
| KR | 10-0959606 | 5/2010 |
| KR | 10-0997787 | 11/2010 |
| KR | 10-2011-0037401 | 4/2011 |
| KR | 10-2011-0105158 | 9/2011 |

* cited by examiner

*Primary Examiner* — Long K Tran
*Assistant Examiner* — Dzung Tran
(74) *Attorney, Agent, or Firm* — William Park & Associates Patent Ltd.

(57) ABSTRACT

Semiconductor packages are provided. The semiconductor package includes a first chip having a first inclined sidewall in an edge of the first chip; and a second chip having a second inclined sidewall in an edge of the second chip and the second chip being horizontally adjacent to the first chip such that the first and second inclined sidewalls are in substantial contact with each other.

12 Claims, 8 Drawing Sheets

SEMICONDUCTOR PACKAGES HAVING THE FIRST AND SECOND CHIP INCLINED SIDEWALLS CONTACT WITH EACH OTHER

CROSS-REFERENCES TO RELATED APPLICATIONS

The present application claims priority under 35 U.S.C 119(a) to Korean Application No. 10-2012-0028335, filed on Mar. 20, 2012, in the Korean intellectual property Office, which is incorporated herein by reference in its entirety.

BACKGROUND

1. Technical Field

Embodiments of the present disclosure relate to semiconductor packages, electronic systems employing the same and methods of manufacturing the same.

2. Related Art

Semiconductor devices, which are utilized as important devices in electronic systems, may include active elements and passive elements constituting semiconductor integrated circuits. These active and passive elements may be integrated in semiconductor substrates (e.g., semiconductor wafers), and each of the semiconductor substrates including the active and passive elements may be sliced into a plurality of semiconductor chips (or semiconductor dice). Each of the semiconductor chips may be referred to as the semiconductor device. The semiconductor devices including the integrated circuits may be mounted on a package substrate or a silicon interposer and encapsulated using an assembly process, thereby forming semiconductor packages. The semiconductor packages may be mounted on a printed circuit board (PCB) having circuit interconnections. The PCB may be widely used in electronic systems such as computers, mobile systems and/or data storage media.

With the development in smaller, lighter and higher performance electronic systems (or electronic products), demand for techniques on more densely packaging semiconductor devices has increased. That is, techniques for increasing the number of the semiconductor chips mounted in a limited area have been continuously developed to provide smaller and higher performing semiconductor packages. For example, volatile memory chips such as dynamic random access memory (DRAM) devices and/or nonvolatile memory chips such as NAND-type flash memory devices may be vertically stacked to provide a large capacity semiconductor memory package. Accordingly, efforts have been concentrated on multi-chip stacked packages or system-in-packages.

SUMMARY

Various embodiments are directed toward semiconductor packages and methods of fabricating the same.

Further, various embodiments may be directed to electronic systems employing semiconductor packages.

According to various embodiments, a semiconductor package may include a first chip having a first inclined sidewall in an edge of the first chip; and a second chip having a second inclined sidewall in an edge of the second chip and the second chip being horizontally adjacent to the first chip such that the first and second inclined sidewalls are in substantial contact with each other.

According to further embodiments, a method of manufacturing a semiconductor package includes providing a first chip including a first through electrode that generally vertically penetrates an edge of the first chip; providing a second chip including a second through electrode that generally vertically penetrates an edge of the second chip; applying a slant sawing process to an edge of the first and second chips to form a first inclined sidewall of the first chip, a second inclined sidewall of the second chip, a first inclined surface of the first through electrode and a first inclined surface of the second through electrode; and horizontally combining the first chip with the second chip such that the first and second inclined sidewalls substantially contact each other, wherein the first inclined surface of the first through electrode is substantially coplanar with the first inclined sidewall and the first inclined surface of the second through electrode is substantially coplanar with the second inclined sidewall, and wherein the first and second chips are horizontally combined with each other such that the first inclined surfaces of the first and second through electrodes substantially contact each other.

According to further embodiments, a method of manufacturing a semiconductor package includes providing first, second, and third chips that include first, second, and third through electrodes respectively, the first, second, and third through electrodes generally vertically penetrating respective edges of the first, second, and third chips; applying a slant sawing process to the edges of the first and second chips to form a first inclined sidewall of the first chip, a second inclined sidewall of the second chip, a first inclined surface of the first through electrode and a first inclined surface of the second through electrode; and horizontally combining the first chip with the second chip on the third chip such that the first and second inclined sidewalls are in substantial contact with each other and the first and second through electrodes are substantially vertically aligned with the third through electrode, wherein the first inclined surface of the first through electrode is substantially coplanar with the first inclined sidewall and the first inclined surface of the second through electrode is substantially coplanar with the second inclined sidewall, and wherein the first inclined surfaces of the first and second through electrodes are in substantial contact with each other and the third through electrode is in substantial contact with the second through electrode after generally aligning the first, second, and third through electrodes. According to further embodiments, a method of manufacturing a semiconductor package includes applying a slant sawing process to an edge of a first chip and an edge of a second chip to form a first inclined sidewall of the first chip and a second inclined sidewall of the second chip; horizontally combining the first chip with the second chip such that the first and second inclined sidewalls substantially contact each other; and forming a common through electrode that substantially penetrates the first and second inclined sidewalls and generally vertically extends to pass through the first and second chips.

According to further embodiments, an electronic system includes a main board; and a semiconductor package mounted on the main board, wherein the semiconductor package comprises a first chip having a first inclined sidewall in an edge of the first chip; and a second chip having a second inclined sidewall in an edge of the second chip and the second chip being horizontally adjacent to the first chip such that the first and second inclined sidewalls are in substantial contact with each other.

According to further embodiments, an electronic system includes a first chip; a first through electrode that substantially penetrates the first chip to have a first end which is substantially exposed at a sidewall of the first chip; a second chip disposed to be horizontally adjacent to the substantially exposed first end of the first through electrode; and a second through electrode that substantially penetrates the second chip to have a first end which is connected to the first end of the first through electrode

BRIEF DESCRIPTION OF THE DRAWINGS

Various embodiments may become more apparent in view of the attached drawings and accompanying detailed description.

DETAILED DESCRIPTION

Figure 1:
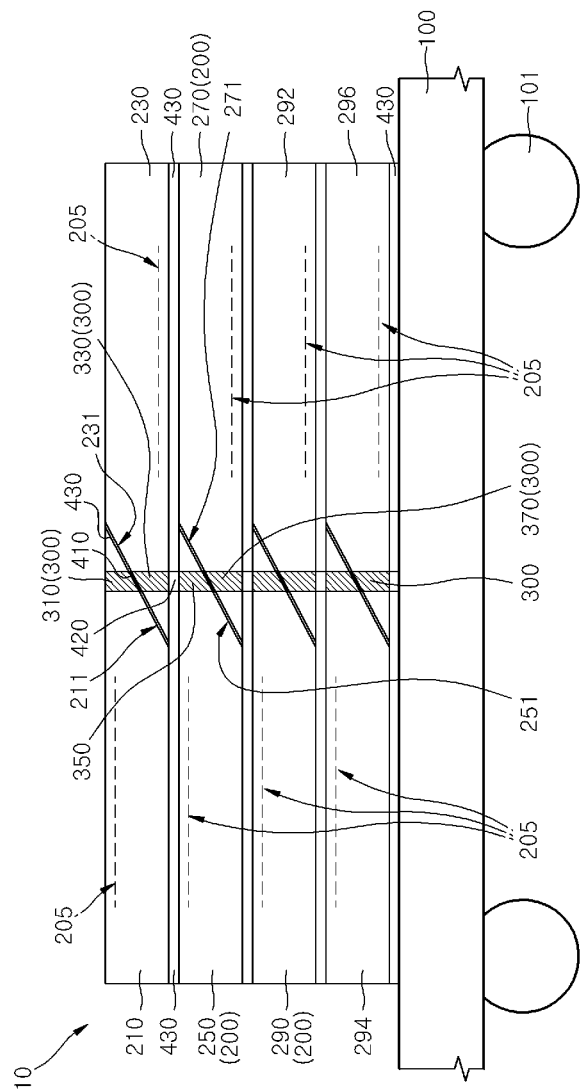
FIGS. 1 to 5 are cross sectional views illustrating an example of a semiconductor package according to various embodiments and methods of manufacturing the same.

According to various embodiments, a plurality of semiconductor chips may be stacked on a limited area of a package substrate, thereby providing semiconductor packages which may be appropriate for minimization of lengths of interconnection lines between the semiconductor chips. Additionally, methods may be provided for semiconductor packages which may be appropriate for manufacturing these semiconductor packages.

It will be understood that although the terms first, second, third etc. may be used herein to describe various elements, these elements should not be limited by these terms. These terms are only used to distinguish one element from another element. Thus, a first element in various embodiments could be termed a second element in other embodiments without departing from the teachings of the present invention.

It will also be understood that when an element is referred to as being located "under", "beneath," "below", "lower," "on", "over", "above," "upper", "side" or "aside" another element, it may be directly in contact with the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the inventive concept.

It will be further understood that the term "semiconductor chip" used herein may correspond to a semiconductor die including a DRAM circuit or a flash memory circuit. Moreover, it will be understood that the term "substrate" used herein may correspond to a supporting member such as a printed circuit board (PCB) or an interposer which may be used in assembly processes.

The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It is to be understood herein that the drawings are not necessarily to scale and in some instances proportions may have been exaggerated in order to more clearly depict certain features of the invention. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added FIGS. 1 to 5 are cross sectional views illustrating an example of a semiconductor package according to various embodiments and methods of manufacturing the same.

Referring to FIG. 1, a semiconductor package 10 according to an embodiment may include a package substrate 100 and a plurality of semiconductor chips 200 generally stacked vertically and laterally on the package substrate 100. Because the plurality of semiconductor chips 200 may be generally stacked vertically and laterally on the package substrate 100, the number of the semiconductor chips 200 stacked in a limited area of the package substrate 100 may be maximized to increase the packaging density of the semiconductor package 10.

One of the semiconductor chips 200 may correspond to an electronic device including integrated circuits which may be realized at active surfaces 205 of a semiconductor substrate. For example, at least one of the semiconductor chips 200 may correspond to a volatile memory device such as a DRAM device or a nonvolatile memory device such as a flash memory device. Alternatively, the semiconductor chips 200 may include a communication chip for network communication and/or a control chip for controlling the operation of memory chips. In various embodiments, the semiconductor chips 200 stacked on the single package substrate 100 may include at least one of a memory chip, a communication chip, or a control chip. In addition, at least one of the semiconductor chips 200 may include a through electrode 300 such as a through silicon via (TSV), which may function as a member electrically connecting the corresponding semiconductor chip 200 to an external device or an external system. The through electrode 300 may penetrate a portion of an edge of the corresponding semiconductor chip 200, which may be adjacent to and/or spaced apart from the active surfaces 205 of the semiconductor chip 200. The through electrode 300 may be electrically connected to the integrated circuits formed at the active surfaces 205 through interconnection lines (not shown) such as redistributed lines.

The package substrate 100 may be used to generally support the semiconductor chips 200 when the semiconductor chips 200 are stacked. Further, the package substrate 100 may include a plurality of interconnection lines for electrically connecting the semiconductor chips 200 to external devices or external systems. For example, the package substrate 100 may correspond to a printed circuit board (PCB) or an interposer. When the package substrate 100 is a PCB, the package substrate 100 may be configured to include a core substrate (or an insulation substrate), circuit interconnection lines disposed on the core substrate, and conductive pads for electrically connecting the circuit interconnection lines to external devices. Alternatively, when the package substrate 100 is an interposer, the package substrate 100 may be configured to include a silicon substrate, circuit interconnection lines disposed on the silicon substrate, via contact plugs, and conductive pads for electrically connecting the circuit interconnection lines to external devices.

Figure 2:
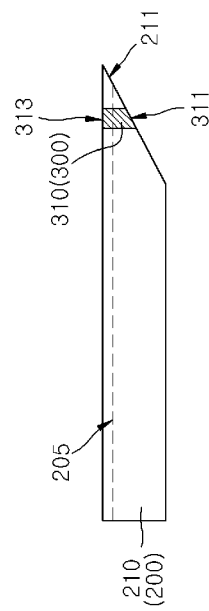

Referring to FIGS. 1 and 2, the semiconductor chips 200 may include a first semiconductor chip 210. When an upper surface of the first semiconductor chip 210 corresponds to a front surface (adjacent to the active surface 205) thereof, the first semiconductor chip 210 may include a first inclined sidewall 211 having a slope which may be negative as illustrated in FIG. 2. That is, an upper width of the first semiconductor chip 210 may be greater than a lower width thereof. Further, the first semiconductor chip 210 may include at least one first through electrode 310 that generally penetrates vertically, an edge portion having the first inclined sidewall 211. A first contact surface 311 (e.g., a bottom surface) of the first through electrode 310 may be substantially coplanar with the first inclined sidewall 211 of the first semiconductor chip 210, and a second contact surface 313 (e.g., a top surface) of the first through electrode 310 may be substantially coplanar with the front surface of the first semiconductor chip 210. Accordingly, when the second contact surface 313 of the first through electrode 310 generally has a circular shape from a plan point of view, the first contact surface 311 of the first through electrode 310 may generally have an oval shape. That is, a surface area of the first contact surface 311 may be greater than a surface area of the second contact surface 313. The at least one first through electrode 310 may be electrically connected to integrated circuits formed generally at the active surfaces 205 through interconnection lines such as redistributed lines. In various embodiments, the number of the at least one first through electrode 310 may be two or more. In various embodiments, the first semiconductor chip 210 may include two or more first inclined sidewalls 211 and two or more first through electrodes 310 penetrating the first inclined sidewalls 211.

In various embodiments, the semiconductor chips 200 may further include second to eighth semiconductor chips 230, 250, 270, 290, 292, 294, and 296, respectively. Each of the second to eighth semiconductor chips 230, 250, 270, 290, 292, 294, and 296, respectively, may have the same or similar shape as the first semiconductor chip 210. For example, the second to fourth semiconductor chips 230, 250, and 270, respectively, may include a second inclined sidewall 231, a third inclined sidewall 251, and a fourth inclined sidewall 271, respectively. In addition, the second to fourth semiconductor chips 230, 250, and 270, respectively, may include a second through electrode 330 substantially penetrating the second inclined sidewall 231, a third through electrode 350 substantially penetrating the third inclined sidewall 251, and a fourth through electrode 370 substantially penetrating the fourth inclined sidewall 271, respectively.

The semiconductor chips 200 may have substantially the same or the same configuration. For example, the semiconductor chips 200 may have the same or substantially the same functional circuits. Alternatively, the semiconductor chips 200 may have different configurations and/or different functional circuits from each other.

Figure 3:
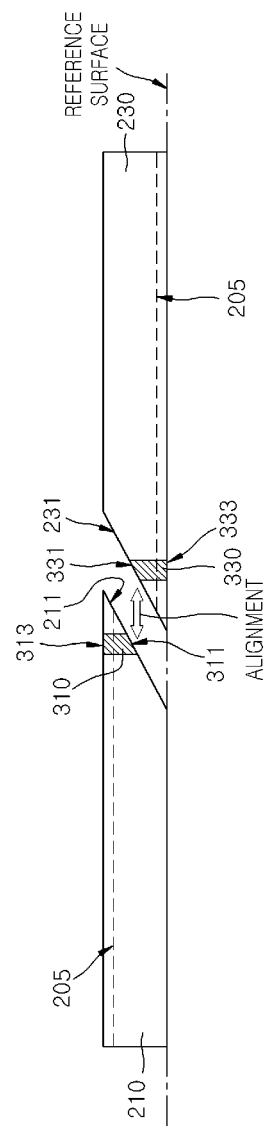

Referring to FIGS. 1 and 3, the first semiconductor chip 210 including the first through electrode 310 may be mounted substantially on the package substrate 100. The second semiconductor chip 230 including the second through electrode 330 may be provided. The second through electrode 330 may also have a first contact surface 331 which is substantially coplanar with the second inclined sidewall 231 of the second semiconductor chip 230 and a second contact surface 333 which is substantially coplanar with the front surface of the second semiconductor chip 230.

The second semiconductor chip 230 may be flipped upside down, and the flipped second semiconductor chip 230 may be mounted substantially on the package substrate 100 such that the first and second inclined sidewalls 211 and 231 generally face and make substantial contact with each other on a reference surface. That is, the first semiconductor chip 210 and the flipped second semiconductor chip 230 may be generally aligned and combined with each other, thereby electrically connecting the first through electrode 310 to the second through electrode 330. In the event that the first and second inclined sidewalls 211 and 231 have substantially the same slope, the first and second through electrodes 310 and 330 may be vertically self-aligned with each other even without use of any specific alignment marks. Accordingly, the first and second semiconductor chips 210 and 230 may be more readily mounted substantially on the package substrate 100 to minimize the assembly process failure rate. Moreover, each of the first contact surface 311 and the first contact surface 331 may generally have an oval shape, as described above. Thus, a contact area between the first and second through electrodes 310 and 330 may be increased when the first and second through electrodes 310 and 330 are generally vertically aligned with each other.

Although the present embodiment is described in conjunction with an example that each of the first and second semiconductor chips 210 and 230 has a negative sloped sidewall, the inventive concept is not limited thereto. For example, while the first semiconductor chip 210 may have a negative sloped sidewall, the second semiconductor chip 230 may have a positive sloped sidewall. In such a case, when the first and second semiconductor chips 210 and 230 are combined with each other to connect the first through electrode 310 to the second through electrode 330, the active surfaces 205 of the first and second semiconductor chips 210 and 230 may be substantially coplanar with each other.

After the second semiconductor chip 230 is generally aligned with the first semiconductor chip 210, the first contact surface 311 of the first through electrode 310 may be combined with the first contact surface 331 of the second through electrode 330. The first and second through electrodes 310 and 330, which may be vertically aligned and combined with each other, may constitute a single common through electrode. A top surface of the common through electrode may correspond to the second contact surface 313 of the first through electrode 310, and a bottom surface of the common through electrode may correspond to the second contact surface 333 of the second through electrode 330.

In various embodiments, a first conductive adhesion layer 410 including a metal layer such as a solder layer may be introduced into an interface between the first contact surface 311 of the first through electrode 310 and the first contact surface 331 of the second through electrode 330. Further, an insulation layer 430 may be introduced into an interface substantially between the first and second inclined sidewalls 211 and 231 for adhesion. The adhesive insulation layer 430 may include an under-fill layer, a non-conductive paste layer, or a non-conductive film.

According to the various embodiments, the first and second semiconductor chips 210 and 230 may be combined with each other to substantially attach the first inclined sidewall 211 to the second inclined sidewall 231. Thus, even though the first and second semiconductor chips 210 and 230 may be generally disposed horizontally adjacent to each other, no interconnection lines (or redistributed lines) may be required to electrically connect the first semiconductor chip 210 to the second semiconductor chip 230. Consequently, the length of an electrical signal path between the first and second semiconductor chips 210 and 230 may be minimized to improve the operation speed of the semiconductor package and to omit the processes of forming the interconnection lines and/or the redistributed lines.

Referring again to FIG. 1, other semiconductor chips, for example, the third to eighth semiconductor chips 250, 270, 290, 292, 294, and 296, respectively, may be further disposed generally under or generally on the first and second semiconductor chips 210 and 230, respectively, using the same manners as described with reference to FIG. 3. For example, the third semiconductor chip 250 may be disposed substantially under the first semiconductor chip 210, and the fourth semiconductor chip 270 may be generally disposed horizontally adjacent to the third semiconductor chip 250 and to be located substantially under the second semiconductor chip 230. Similarly, the fifth to eighth semiconductor chips 290, 292, 294, and 296, respectively may be disposed generally under the third and fourth semiconductor chips 250 and 270, respectively. The first to eight semiconductor chips 210, 230, 250, 270, 290, 292, 294, and 296, which may be generally horizontally and vertically stacked, may be mounted substantially on the package substrate 100. The third and fourth through electrodes 350 and 370, respectively, may be combined with each other using the same manners as that of the first and second through electrodes 310 and 330, respectively, and how they are combined with each other.

After the first and second semiconductor chips 210 and 230 are combined with each other and the third and fourth semiconductor chips 250 and 270 are combined with each other, the second contact surface 333 of the second through electrode 330 may be in substantial contact with a generally exposed surface of the third through electrode 350. As a result, the first to fourth semiconductor chips 210, 230, 250, and 270, respectively, may be electrically connected to each other. Further, the second through electrode 330 may be directly combined with the third through electrode 350. Thus, no interconnection lines and/or no redistributed lines may be required to electrically connect the first and second semiconductor chips 210 and 230, respectively, to the third and fourth semiconductor chips 250 and 270, respectively. Consequently, lengths of electrical signal paths between the first to fourth semiconductor chips 210, 230, 250, and 270, respectively, may be minimized to improve the operation speed of the semiconductor package and to omit the processes for forming the interconnection lines and/or the redistributed lines. In various embodiments, a second conductive adhesion layer 420 including a metal layer such as a solder layer may be introduced into an interface substantially between the second through electrode 330 and the third through electrode 350. Further, an adhesive insulation layer 430 may be introduced into an interface substantially between the first and third semiconductor chips 210 and 250, respectively, as well as into an interface between the second and fourth semiconductor chips 230 and 270, respectively. The third or fourth semiconductor chip 250 or 270, respectively, may have substantially the same configuration and/or substantially the same size as the first or second semiconductor chip 210 or 230, respectively. Alternatively, the third or fourth semiconductor chip 250 or 270, respectively, may have a different configuration and/or a different size from the first or second semiconductor chip 210 or 230, respectively.

The plurality of semiconductor chips 200 may be generally horizontally and vertically stacked substantially on the package substrate 100, thereby constituting the semiconductor package 10. Further, the plurality of semiconductor chips 200 may be substantially encapsulated by a protection layer, for example, an epoxy molding compound (EMC) material using, for example, a molding process. The protection layer may also constitute the semiconductor package 10. In addition, external connection terminals 101 such as solder balls may be generally attached to or formed on the package substrate 100 generally opposite to the plurality of semiconductor chips 200. The external connection terminals 101 may be formed to electrically connect the plurality of semiconductor chips 200 to an external device or an external system. As described above, the plurality of semiconductor chips 200 may be generally horizontally and vertically stacked on the package substrate 100, thereby increasing the packaging density of the semiconductor package 10.

Each of the semiconductor chips 200 may have at least one generally inclined sidewall, and the generally inclined sidewalls of the semiconductor chips 200 may have substantially the same slope. Thus, when a first one of the semiconductor chips 200 is horizontally combined with a second flipped one of the other semiconductor chips 200 such that the generally inclined sidewalls of the first semiconductor chip and the second flipped semiconductor chip are in substantial contact with each other, the first semiconductor chip and the second flipped semiconductor chip may be more readily self-aligned with each other. As a result, it may be easy to electrically connect the first through electrode vertically penetrating the inclined sidewall of the first semiconductor chip to the second through electrode vertically penetrating the inclined sidewall of the second flipped semiconductor chip. Thus, even though the first semiconductor chip and the second flipped semiconductor chip are combined to be horizontally adjacent to each other, no interconnection lines (or redistributed lines) may be required to electrically connect the first semiconductor chip to the second flipped semiconductor chip. Consequently, lengths of electrical signal paths substantially between the first and second semiconductor chips may be minimized to improve the operation speed of the semiconductor package and to omit the processes for forming the interconnection lines and/or the redistributed lines.

Moreover, the first and second through electrodes may generally be vertically aligned with each other when the first semiconductor chip including the first through electrode is horizontally combined with the second flipped semiconductor chip including the second through electrode. Thus, a planar area where the first semiconductor chip and the second flipped semiconductor chip occupy may be minimized reducing a total size of semiconductor package 10.

Figure 4:
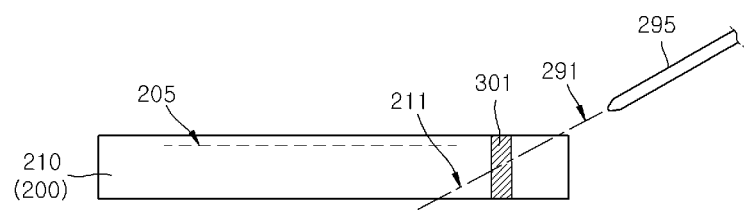
Figure 5:
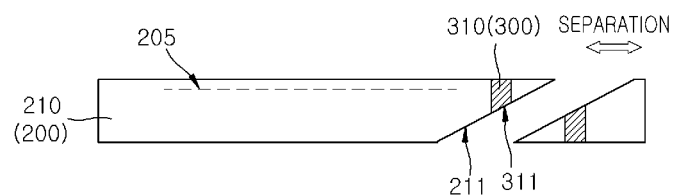

Referring to FIG. 4, the first semiconductor chip 210 may be formed to include at least one through electrode 301 that substantially penetrates, generally, an edge of the first semiconductor chip 210. A slant sawing process may be applied to the edge portion including the through electrode 301, thereby forming the first inclined sidewall 211. The first inclined sidewall 211 may be formed using diverse manners. In an embodiment, a sawing blade 295 may be disposed to be substantially adjacent to the edge portion and may be tilted toward a sloped direction 291. Subsequently, the edge portion including the through electrode 301 may be sliced using the tilted sawing blade 295 to generally separate a part of the edge portion from the first semiconductor chip 210, as illustrated in FIG. 5. As a result, the first through electrode 310 having the first contact surface 311 and the first inclined sidewall 211 may be formed in the remaining edge portion. Each of the second to eighth semiconductor chips 230, 250, 270, 290, 292, 294, and 296, respectively, may be formed using the same manners as described with reference to FIGS. 4 and 5. As described above, the first to eighth semiconductor chips 210, 230, 250, 270, 290, 292, 294, and 296, respectively, having the generally inclined sidewalls may substantially be horizontally and vertically combined with each other and may be mounted substantially on the package substrate 100.

Figure 6:
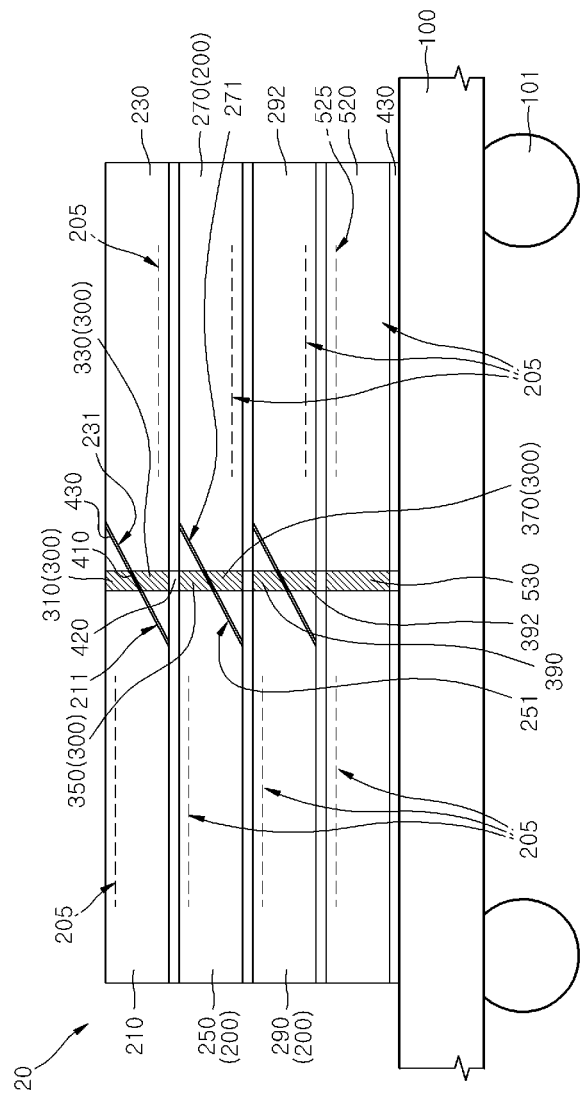
FIG. 6 is a cross sectional view illustrating an example of a semiconductor package according to an embodiment and a method of manufacturing the same.

FIG. 6 is a cross sectional view illustrating an example of a semiconductor package according to an embodiment and method of manufacturing the same.

Referring to FIG. 6, a semiconductor package 20 according to an embodiment may include at least one semiconductor chip having a different configuration and/or a different size from the semiconductor chips 200 of the embodiment described with reference to FIG. 1. For example, the semiconductor package 20 may include a ninth semiconductor chip 520 instead of the seventh and eighth semiconductor chips 294 and 296, respectively, as illustrated in FIG. 1. The ninth semiconductor chip 520 may have a different functional circuit and/or a different size from the first to eighth semiconductor chips 210, 230, 250, 270, 290, 292, 294, and 296, respectively. The ninth semiconductor chip 520 may include a ninth through electrode 530 that penetrates a substrate thereof. The ninth semiconductor chip 520 may be generally aligned and combined with the fifth and sixth semiconductor chips 290 and 292, respectively, such that the ninth through electrode 530 is in substantial contact with the sixth through electrode 392 of the sixth semiconductor chip 292. In an embodiment, ninth semiconductor chip 520 may correspond to a control chip that includes different integration circuits (e.g., control circuits) from the first to sixth semiconductor chips 210, 230, 250, 270, 290, and 292, respectively. The control circuits of the ninth semiconductor chip 520 may be formed generally at active surfaces 525 of the ninth semiconductor chip 520.

Figure 7:
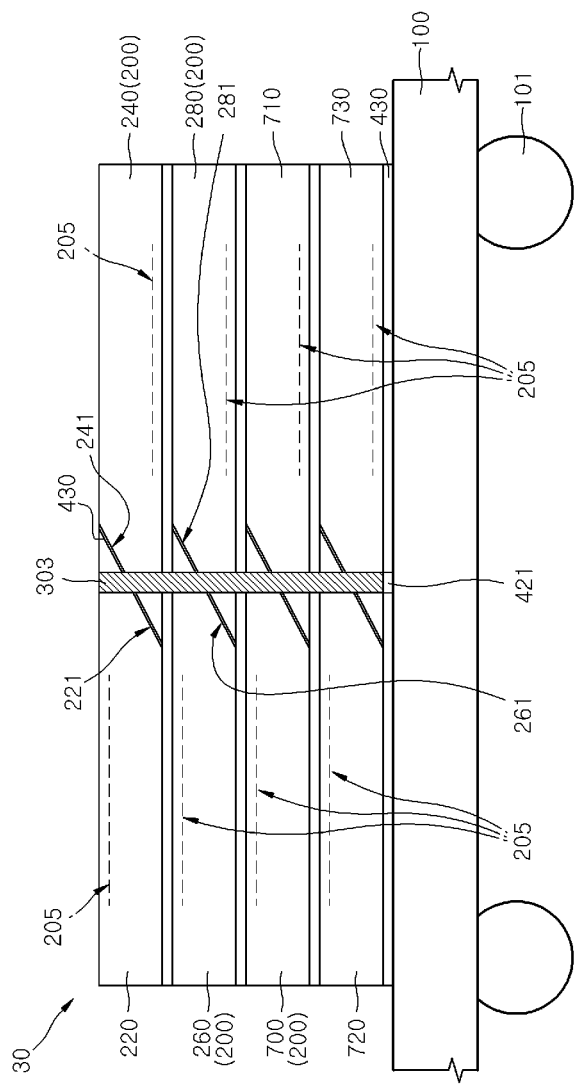
FIGS. 7, 8, and 9 are cross sectional views illustrating an example of a semiconductor package according to an embodiment and method of manufacturing the same.
Figure 8:
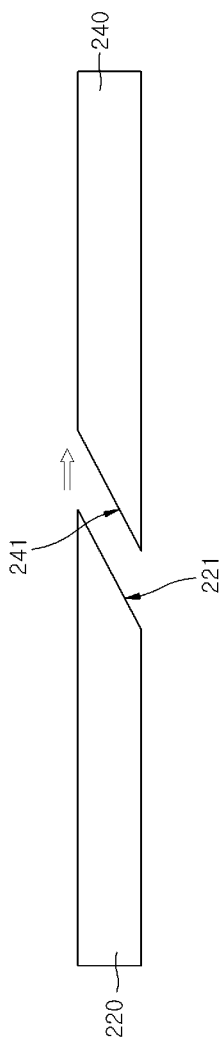
Figure 9:
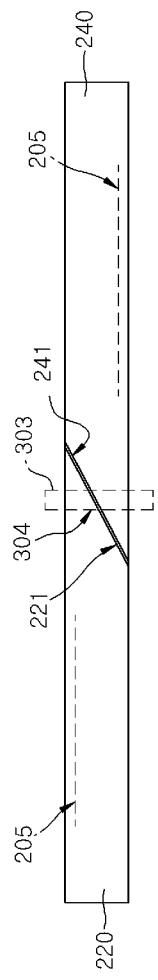

FIGS. 7, 8 and 9 are cross sectional views illustrating an example of a semiconductor package according to an embodiment and methods of manufacturing the same.

Referring to FIG. 7, a semiconductor package 30 according to the present modified embodiment may be fabricated by horizontally and vertically stacking a plurality of semiconductor chips, for example, first to eighth semiconductor chips 220, 240, 260, 280, 700, 710, 720, and 730, respectively, having generally inclined sidewalls using the same manners as described with reference to FIG. 1 and by forming a common through electrode 303 that substantially penetrates the first to eighth semiconductor chips 220, 240, 260, 280, 700, 710, 720, and 730, respectively. As illustrated in FIG. 8, a first inclined sidewall 221 of the first semiconductor chip 220 and a second inclined sidewall 241 of the second semiconductor chip 240 may be formed using the slant sawing process described with reference to FIGS. 4 and 5 without the formation of through electrodes thereof. The third and fourth semiconductor chips 260 and 280, respectively, may also be formed to include third and fourth inclined sidewalls 261 and 281, respectively. The first semiconductor chip 220 may be generally aligned and combined with the second flipped semiconductor chip 240 such that the first inclined sidewall 221 and the second inclined sidewall 241 are in substantial contact with each other. In addition, the fifth to eighth semiconductor chips 700, 710, 720, and 730, respectively, may be formed to include their generally inclined sidewalls. The third to eighth semiconductor chips 260, 280, 700, 710, 720, and 730, respectively, may be stacked generally under or above the first and second semiconductor chips 220 and 240, respectively, without formation of their through electrodes.

Subsequently, the first to eighth semiconductor chips 220, 240, 260, 280, 700, 710, 720, and 730, respectively, may be patterned to form a through hole 304 that substantially vertically penetrates the first to eighth generally inclined sidewalls of the first to eighth semiconductor chips 220, 240, 260, 280, 700, 710, 720, and 730, respectively. A conductive material may substantially fill the through hole 304 to form the common through electrode 303. As illustrated in FIG. 7, a conductive adhesion layer 421 may be introduced into an interface generally between the common through electrode 303 and the package substrate 100.

Figure 10:
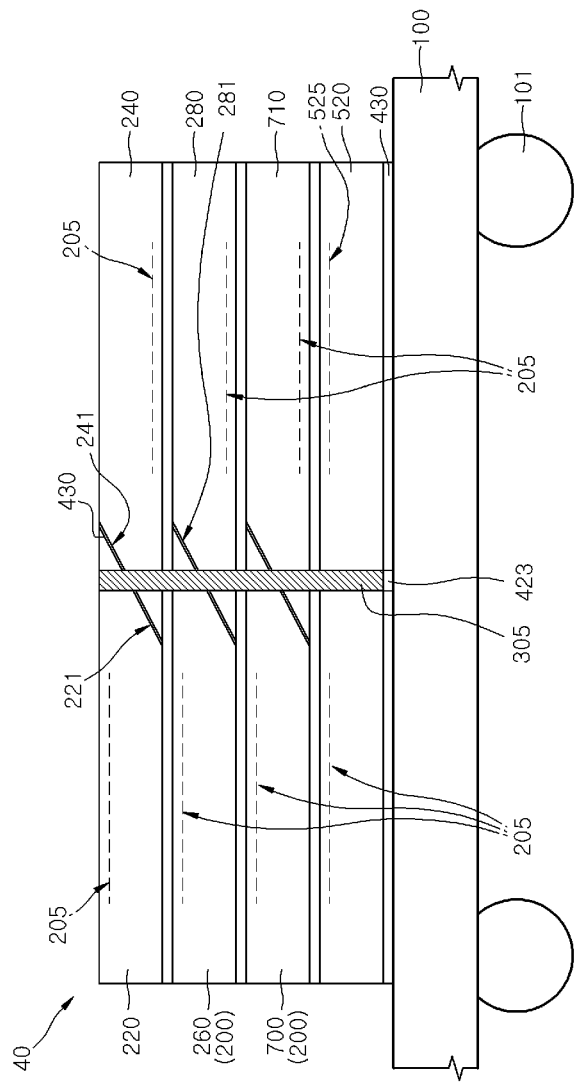
FIG. 10 is a cross sectional view illustrating an example of a semiconductor package according to an embodiment and method of manufacturing the same.

FIG. 10 is a cross sectional view illustrating an example of a semiconductor package according to an embodiment and method of manufacturing the same.

Referring to FIG. 10, a semiconductor package 40 according to the present modified embodiment may include at least one semiconductor chip having a different configuration and/or a different size from the semiconductor chips 220, 240, 260, 280, 700, and 710 of the embodiment illustrated in FIG. 7. For example, the semiconductor package 40 may include the ninth semiconductor chip 520 instead of the seventh and eighth semiconductor chips 720 and 730, respectively, illustrated in FIG. 7. The ninth semiconductor chip 520 may have a different functional circuit and/or a different size from the first to sixth semiconductor chips 220, 240, 260, 280, 700, and 710, respectively. The ninth semiconductor chip 520 may be mounted generally on the package substrate 100, and the first to sixth semiconductor chips 220, 240, 260, 280, 700, and 710, respectively, may be stacked substantially on the ninth semiconductor chip 520 generally opposite to the package substrate 100. A common through electrode 305 may be formed to penetrate the generally inclined sidewalls of the first to sixth semiconductor chips 220, 240, 260, 280, 700, and 710, respectively. The common through electrode 305 may extend to substantially penetrate a portion of the ninth semiconductor chip 520. The common through electrode 305 may be electrically connected to the package substrate 100 through a conductive adhesion layer 423.

Figure 11:
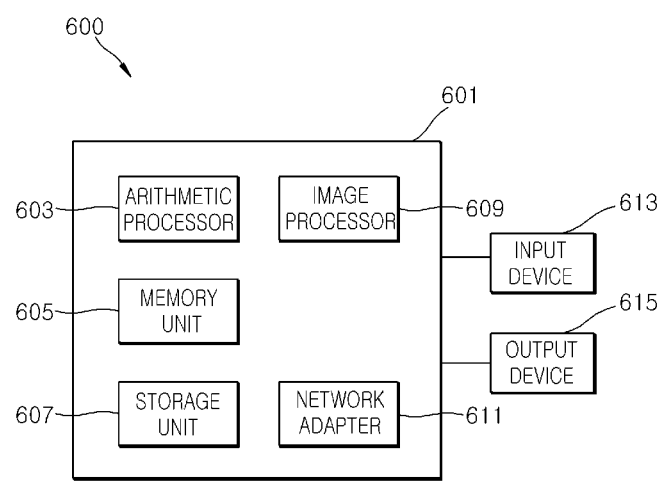
FIG. 11 is a schematic block diagram illustrating an example of an electronic systems employing semiconductor packages according to various embodiments.

FIG. 11 is a schematic block diagram illustrating an example of electronic systems employing semiconductor packages according to various embodiments.

The semiconductor packages according to the previously described embodiments may be employed in electronic systems 600, for example, computers, mobile phones, or the like. The electronic system 600 may be configured to include a main board 601 and various electronic devices and/or packages mounted to the main board 601. The main board 601 may be a printed circuit board (PCB). At least one of the electronic devices and/or packages may be realized using any one of the embodiments described with reference to FIGS. 1 to 10.

The electronic system 600 may include an arithmetic processor 603, a memory unit 605, a storage unit 607, an image processor 609, and a network adapter 611 that may be mounted to the main board 601 to communicate with each other through a data bus (not shown). The arithmetic processor 603 may be a microprocessor, and the memory unit 605 may be a semiconductor package including memory chips such as DRAM chips and a logic chip that controls the operation of the memory chips. Further, the storage unit 607 may include a nonvolatile memory device and/or a hard disk, and the image processor 609 may be a semiconductor package including memory chips such as video DRAM chips for temporarily storing video data and a video controller for processing/controlling the video data stored in the video DRAM chips. In addition, the network adapter 611 may correspond to an interface unit. That is, the network adapter 611 may transmit electrical data to an external communication network or may receive electrical data from the external communication network.

Program data stored in the storage unit 607 may be loaded in the memory unit 605 through the data bus and may be executed by the arithmetic processor 603. In various embodiments, the storage unit 607 may be configured to include a solid state disk (SSD), also referred to as a solid state drive) having a plurality of flash memory devices. In addition, the electronic system 600 may further include an input device 613 for receiving data and an output device 615 for displaying data processed therein. The input device 613 may include a keyboard or a touch sensitive display screen, and the output device 615 may include a display monitor, a printer, or a display screen. The electronic system 600 may correspond to a personal computer, a server or a mobile system. The mobile system may include a laptop computer, a handheld computer, or a smart phone.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor package comprising:
    a first chip having a first inclined sidewall in an edge of the first chip;
    a second chip having a second inclined sidewall in an edge of the second chip and the second chip being horizontally adjacent to the first chip such that the first and second inclined sidewalls are in substantial contact with each other; and
    a common through electrode that substantially penetrates the first and second inclined sidewalls,
    wherein the common through electrode generally vertically extends to substantially penetrate the edges of the first and second chips.

2. The semiconductor package of claim 1, wherein the common through electrode includes:
    a first through electrode penetrating the edge of the first chip and having a first surface which is substantially coplanar with the first inclined sidewall; and
    a second through electrode penetrating the edge of the second chip and having a first surface which is substantially coplanar with the second inclined sidewall.

3. The semiconductor package of claim 1, wherein the first and second chips have the same configuration or a different configuration from each other.

4. The semiconductor package of claim 1, wherein the first and second inclined sidewalls have substantially the same slope to be substantially parallel with each other.

5. The semiconductor package of claim 1, further comprising additional semiconductor chips generally under or generally on and generally above the first and second chips.

6. A semiconductor package comprising:
    a first chip having a first inclined sidewall in an edge of the first chip; and
    a second chip having a second inclined sidewall in an edge of the second chip and the second chip being horizontally adjacent to the first chip such that the first and second inclined sidewalls are in substantial contact with each other;
    a first through electrode penetrating the edge and the first inclined sidewall of the first chip and having a first surface which is substantially coplanar with the first inclined sidewall;
    a second through electrode penetrating the edge and the second inclined sidewall of the second chip and having a first surface which is substantially coplanar with the second inclined sidewall;
    a third chip disposed generally under the first chip; and
    a third through electrode substantially penetrating the third chip and being connected to the second through electrode.

7. The semiconductor package of claim 6, wherein the third chip has the same configuration as, a different configuration from, or a different size from the first chip.

8. A semiconductor package comprising:
    a first chip having a first inclined sidewall in an edge of the first chip;
    a second chip having a second inclined sidewall in an edge of the second chip and the second chip being horizontally adjacent to the first chip such that the first and second inclined sidewalls are in substantial contact with each other;
    a first through electrode penetrating the edge and the first inclined sidewall of the first chip and having a first surface which is substantially coplanar with the first inclined sidewall;
    a second through electrode penetrating the edge and the second inclined sidewall of the second chip and having a first surface which is substantially coplanar with the second inclined sidewall;
    a third chip having a third inclined sidewall in an edge of the third chip and being disposed generally under the first chip;
    a third through electrode that penetrates the edge of the third chip to have a first surface which is substantially coplanar with the third inclined sidewall and a second surface which is in substantial contact with the second through electrode;
    a fourth chip having a fourth inclined sidewall in an edge of the fourth chip and being disposed generally under the second chip; and
    a fourth through electrode that penetrates the edge of the fourth chip to have a first surface which is substantially coplanar with the fourth inclined sidewall and is in substantial contact with the first surface of the third through electrode.

9. The semiconductor package of claim 8, further comprising additional chips which are disposed generally on and generally above the first and second chips generally opposite to the third and fourth chips or disposed generally on and generally under the third and fourth chips opposite to the first and second chips.

10. The semiconductor package of claim 8, further comprising:
    a package substrate on which the third and fourth chips are mounted; and
    external connection terminals on the package substrate generally opposite to the third and fourth chips.

11. A semiconductor package of claim 1, further comprising
    a third chip generally under the first chip; and
    wherein the common through electrode generally vertically extends to substantially penetrate the third chips.

12. A semiconductor package comprising:
    a first chip;
    a first through electrode that substantially penetrates the first chip to have a first end which is substantially exposed at a sidewall of the first chip;
    a second chip disposed to be horizontally adjacent to the substantially exposed first end of the first through electrode; and
    a second through electrode that substantially penetrates the second chip to have a first end which is connected to the first end of the first through electrode.

* * * * *